United States Patent [19]

Voegeli

[11] 4,164,028

[45] Aug. 7, 1979

[54] CURRENT ACCESS BUBBLE MEMORY SYSTEM

[75] Inventor: Otto Voegeli, San Jose, Calif.

[73] Assignee: International Business Machines Corporation, Armonk, N.Y.

[21] Appl. No.: 805,196

[22] Filed: Jun. 9, 1977

[51] Int. Cl.$^2$ ............................................. G11C 19/08
[52] U.S. Cl. ........................................ 365/20; 365/2; 365/18; 365/23; 365/27; 365/31; 365/37
[58] Field of Search ................... 365/2, 5, 13, 19, 20, 365/23, 27, 28, 37, 39, 42, 24, 18

[56] References Cited

U.S. PATENT DOCUMENTS

| | | | |
|---|---|---|---|
| 3,523,286 | 8/1970 | Bobeck et al. | 365/39 |
| 3,786,428 | 1/1974 | Takahashi | 365/5 |
| 3,786,447 | 1/1974 | Yamauchi | 365/39 |
| 4,023,150 | 5/1977 | Voegeli | 365/39 |
| 4,052,708 | 10/1977 | Fairholme | 365/16 |
| 4,059,829 | 11/1977 | Kinsner et al. | 365/19 |

OTHER PUBLICATIONS

AIP Conference Proceedings on Magnetism and Magnetic Materials-No. 24, 1974, pp. 550–551.

*Primary Examiner*—James W. Moffitt
*Attorney, Agent, or Firm*—Joseph E. Kieninger

[57] ABSTRACT

A current access bubble memory system includes a method and device for propagating and switching isolated bubbles within a plurality of orthogonal propagation channels. The device includes two orthogonal arrays of parallel current conductors oriented at 45° angles to the two orthogonal bubble translation axes. The conductors in each array are regularly spaced a distance S apart from center to center. The first array of conductors are connected in parallel to a first current source and the second array of conductors are connected in parallel to a second current source. The propagation channels are defined by confining means to have a width d where d is the bubble diameter. The centerline of the channels are spaced a distance of about $\sqrt{2}\,S/8$ from the center of adjacent conductor intersections. Bubble translation occurs through sequential activation of the two bipolar current sources. Use of specific activation sequences allow selective control of the bubble propagation path at channel intersections. The method provides for flexible design of memory configurations with all accessing and switching functions controllable by means of specific activation sequences of the two current sources.

27 Claims, 9 Drawing Figures

CURRENT ACCESS BUBBLE MEMORY SYSTEM

FIELD OF THE INVENTION

This invention relates to bubble devices and more particularly to a current access bubble memory system.

DESCRIPTION OF THE PRIOR ART

Current access propagation schemes were used for isolated bubble domains during the early days of bubble technology development. Such schemes generally required intricate configurations of serially connected current conductors less than a bubble diameter wide. For electrical insulation of the drive circuits, the conductors were fabricated in two superposed conductor levels separated by an insulation layer. As the long and narrow conductors have limited current carrying capacity and are sensitive to fabrication defects, the current access approach was soon abandoned for isolated bubbles in favor of the structurally simpler field accessing bubble propagation. Field accessing propagation modes are described in the patent to Bobeck U.S. Pat. No. 3,534,346, Bobeck et al. U.S. Pat. No. 3,541,534, Chen et al U.S. Pat. No. 3,797,001, as well as others. The term "field access" characterizes a method which utilizes patterns of soft magnetic elements which are located on top of the domain layer. The elements are of geometries to exhibit magnetic poles in the presence of a magnetic field in the plane of the domain layer. Moreover, the elements are disposed such that the poles are produced in consecutively offset patterns in response to reorientations of the in-plane field so that the domains are moved from an input to an output position along a channel defined by the elements. With a rotating in-plane field, the T and I bar, Y-bar, T-X bar, or C-bar magnetically soft element geometries are commonly employed. The field accessing propagation mode has been the propagation mode most widely used by the industry for some time.

A problem with this type of conventional field access devices is that the density of the memory is limited because the minimum resolution of the propagation element geometries or features is about ¼d. Another problem with field access devices is the cost of the drive coil assembly and associated electronics which constitutes a large portion of the total memory cost. Since the cost of the rotating drive field system is largely independent of memory capacity, the cost of small capacity memories using the field access approach is expensive. It is yet another problem with conventional field access devices that the use of soft magnetic elements on top of the domain layer provides enhanced coupling between adjacent bubbles through such elements. As device operation requires the bubbles to remain essentially non-interacting, a separation of at least four bubble diameters between adjacent bubbles is necessary and storage density is limited accordingly.

While field accessing has been used primarily for isolated bubbles, current accessing, at the present time, is the preferred mode for the propagation of bubbles in a bubble lattice. Widely separated current conductors produce localized driving forces which translate the entire bubble lattice in the desired direction. This type of translation arrangement is described in the patent to Voegeli, U.S. Pat. No. 3,930,244. Typically, present current lattice translation schemes use either two sequentially activated circuits with bipolar drive or three circuits with unipolar drive. The drive conductors are aligned parallel with a lattice symmetry axis and are oriented at 60° to the lattice translation axis.

Another current access propagation scheme specifically for bubble lattice translation is described in co-pending U.S. Patent Application Ser. No. 640,518 filed on Dec. 15, 1975, now U.S. Pat. No. 4,023,150 and assigned to the assignee of the present invention. This current access propagation system is a combination of two arrays of parallel conductors and confining means. One array of parallel conductors is oriented at an angle of 60° to the lattice translation axis. The other array of conductors is at an angle of −60° to the lattice translation axis. Positioned between the rows of bubbles in the lattice are confining means which define the lattice translation axis. This current axis system translates the entire bubble lattice in either of two directions along the translation axis.

A different current drive system, applicable to the propagation of isolated bubbles, has been discussed by Walsh and Charap in the AIP Conference Proceedings, No. 24, p. 550–1 (1974). The system utilizes non-uniform current distributions in a perforated conducting sheet without bubble confining means. In one case, perforations consist of T and I patterns and an zimuthally rotating drive current is used. In a second case, perforations consist of a square array of round holes and an oscillating drive current is used. Propagation is said to occur under asymmetric drive conditions on account of inertial bubble characteristics.

SUMMARY OF THE INVENTION

It is a primary object of this invention to provide an improved current access bubble memory system.

It is another object of this invention to provide an improved current access scheme for isolated bubbles.

It is still another object of this invention to provide a storage density memory system having relaxed minimum feature resolution requirements.

It is yet another object of this invention to provide a storage density memory system having relaxed minimum separation requirements between bubbles.

It is a further object of this invention to provide a lower cost bubble memory system.

It is a still further object of this invention to provide a bubble accessing system suitable for use with either a presence/absence coding scheme or with a coding scheme utilizing different types of bubbles.

It is another further object of this invention to provide a method for performing all accessing functions.

It is still another further object of this invention to provide a method for changing the design configuration of the bubble memory system.

These and other objects are accomplished by a method and device for propagating and switching isolated bubbles within a plurality of orthogonal propagation channels. The device includes two orthogonal arrays of parallel current conductors oriented at 45° angles to the two orthogonal bubble translation axes. The conductors in each array are regularly spaced a distance S apart from center to center. The first array conductors are connected in parallel to a first current source and the second array conductors are connected in parallel to a second current source. The propagation channels are defined by confining means to have a width d where d is the bubble diameter. The centerline of the channels are spaced a distance of about $\sqrt{2}\,S/8$ from the center of adjacent conductor intersections. A "T"

shaped channel configuration has at least one input port and one output port. A merge element exists when there are two input ports, while a switching element exists when there are two output ports. Use of specific current source activation sequences allow selective control of the bubble propagation path at the channel intersections of switch elements. The method provides for flexible design of memory configurations with all accessing and switching functions controllable by means of specific activation sequences of the two current sources.

Other objects of this invention will be apparent from the following detailed description, reference being made to the accompanying drawings were in various embodiments of the invention are shown.

DESCRIPTION OF THE ILLUSTRATIVE EMBODIMENTS

Figure 1:
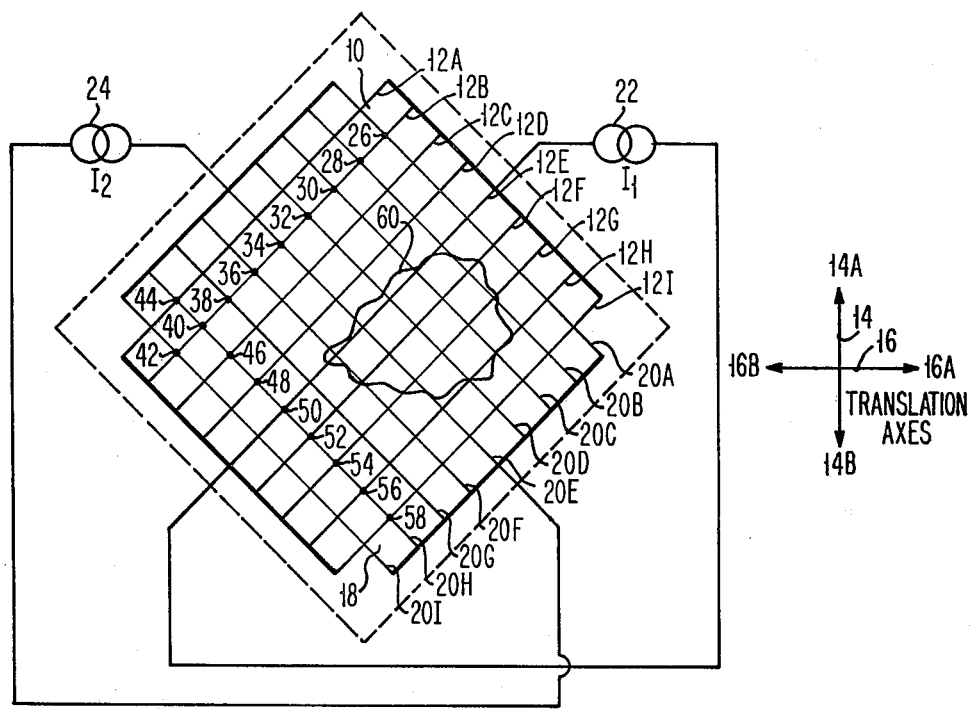
FIG. 1 is a top view showing the position of the first and second arrays of parallel conductors.
Figure 2:
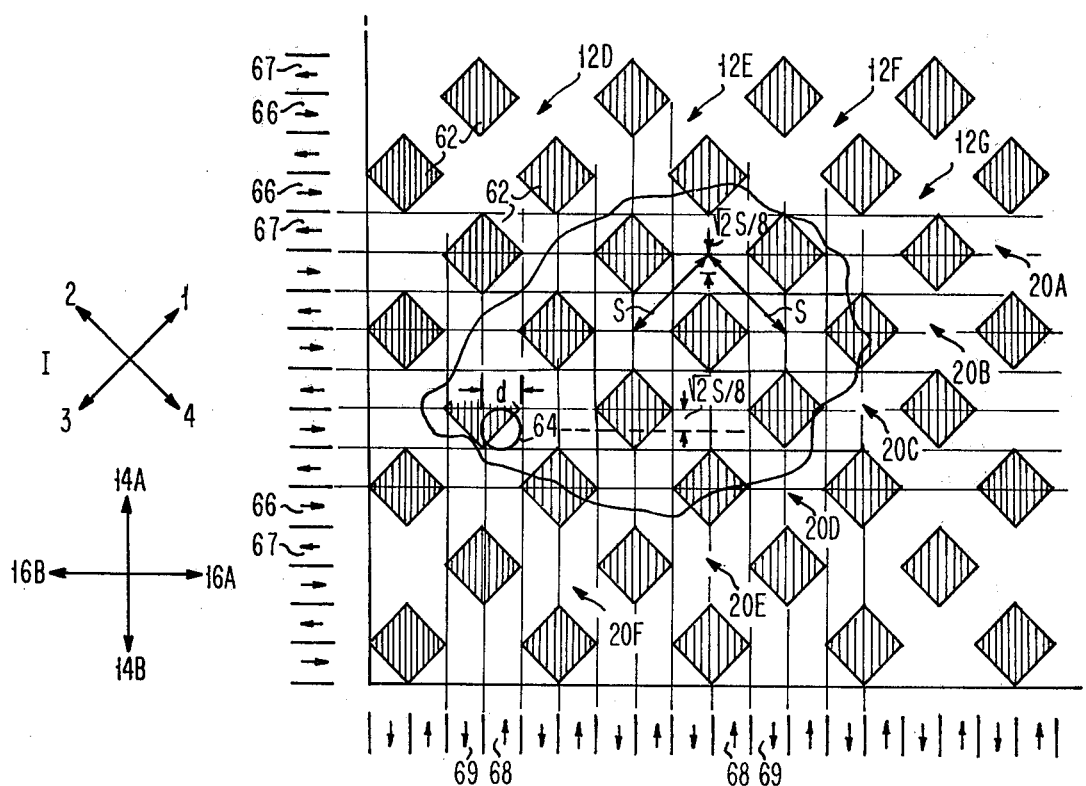
FIG. 2 is an enlarged view of a portion of FIG. 1.

As shown in FIG. 1, an array 10 of parallel conductors 12A through 12I are aligned at an angle of 45° with translation axis 14 and at an angle of −45° with translation axis 16. Another array 18 of parallel conductors 20A through 20I are aligned at an angle of −45° with the translation axis 14. Array 10 may be electrically connected to array 18 as shown in FIG. 2 or array 10 may be electrically insulated from array 18. A bipolar current source 22 is connected to array 10 at both ends of conductors 12A through 12I to form a circuit. Similarly, a bipolar current source 24 is connected to array 18 at both ends of conductors 20A through 20I to form another circuit. The bipolar current sources 22 and 24 are, for example, two sinusoidal current sources which are operated 90° out of phase. The connections to array 10 and to array 18 are made in such a manner that the two circuits are electrically orthogonal in that all conductors of array 10 run along equal potential lines of array 18 and vice versa. For example, conductors 20A through 20I intersect conductor 12B at points 26, 28, 30, 32, 34, 36, 38, 40, and 42. For any current $I_2$, these intersection points are at the same potential and no current is induced in conductor 12B. Similarly, conductors 12A through 12I intersect conductor 20H at points 44, 40, 46, 48, 50, 52, 54, 56, and 58. For any current $I_1$, these intersection points are at the same potential and no current is induced in conductor 20H. Consequently, the conductor arrays 10 and 18 may be electrically insulated or occupy the same plane without affecting their function. The portion 60 of FIG. 1 is enlarged.

As shown in FIG. 2, the array of conductors 12D, E, F, and G intersect conductors 20A, B, C, D, E, and F to provide a continuous metal sheet containing a periodic array of square holes 62. The spacing from center to center of the conductors 12E through G and 20A through 20F is a distance S apart. A bubble 64 having a diameter d is shown. Also shown is a grid of possible propagation channel positions 66, 67 and 68, 69. With a -1-2-3-4- current sequence as indicated, any channel located at a position 66 will translate bubbles in the direction 16A, while channels located at a position 67 translate bubbles in the direction 16B. Similarly, channels located at positions 68 provide for bubble translation in the direction 14A, while channels located at position 69 provide for translation along the direction 14B. These bubble translation directions at potential positions of channels are indicated by arrows along the periphery of FIG. 2. The indicated translation directions correspond to a -1-2-3-4- current sequence. Reversal of the activation sequence to -4-3-2-1- causes a sign reversal on the indicated propagation directions. The width of the channels are of the order of d, the bubble diameter. The centerline of the channels are spaced a distance of about $\sqrt{2}\,S/8$ from the center of adjacent conductor intersections.

The peripheral grid of translation directions thus specifies, relative to the conductor pattern, proper choices of channel positions. The grid can be used to construct, in accord with the desired functional characteristics of the memory, any suitable channel configuration provided that sufficient separation between adjacent channels is maintained. The separation must be such as to keep magnetostatic interactions between adjacent bubbles to an acceptable minimum. Since the current access devices of this invention do not employ any soft-magnetic elements which enhance interactions between bubbles, a lesser separation between adjacent propagation tracks may be used as compared with conventional field access devices. Typically, a center to center channel separation of three bubble diameters suffices in embodiments of this invention.

Figure 3:
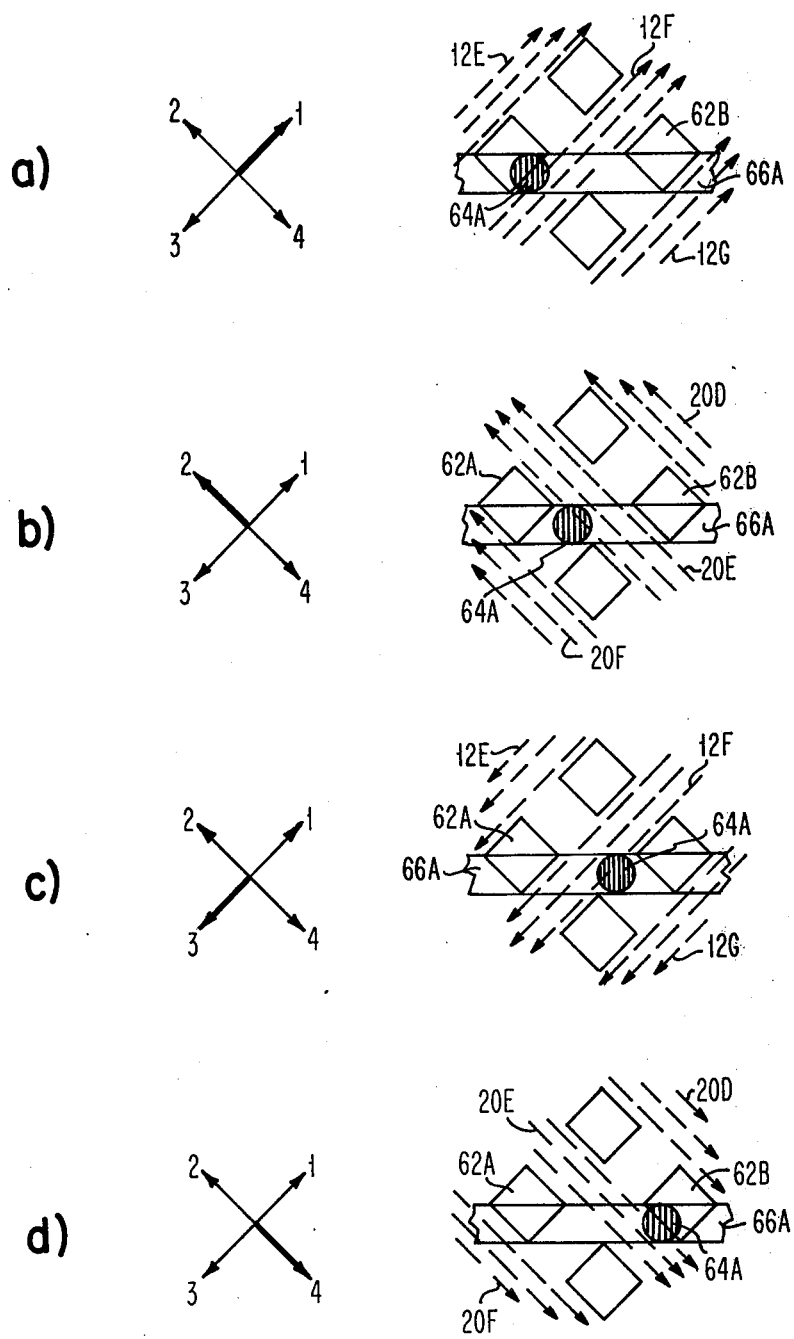
FIG. 3, consisting of a-d, is a schematic view showing the translation mechanism in a horizontal propagation channel.

FIGS. 3A through D show the translation steps of a bubble over one cycle of the drive current consisting of the current sequence 1-2-3-4. In FIG. 3A, the current passes through the conductors 12E, 12F, and 12G in the "-1-" direction of the cycle. The bubble 64A with its magnetization pointing upward is located in channel 66A at an equilibrium position approximately centered under the attractive edge of current conductor 12F. In FIG. 3B, the current is passed through conductors 20D, 20E, and 20F in the "-2-" direction as shown. In response, the bubble 64A in channel 66A moves away from the repulsive edge of current conductor 20F toward the attractive edge of conductor 20E with the final bubble position centered over the attractive edge of conductor 20E as shown. In FIG. 3C, the current is passed through the conductors 12E, 12F, 12G in the "-3-" direction of the cycle. In response, the bubble 66A moves away from the repulsive edge of conductor 12F toward the attractive edge of the same conductor with a final bubble position as shown. In FIG. 3D, the current is passed through 20D, 20E, and 20F in the direction "-4-" of the sequence. The bubble 64A moves so that it is now positioned over the attractive edge of conductor 20E. During one current cycle, that is, 1-2-3-4, the bubble is translated over a distance equal to $\sqrt{2}\,S$, where S is the center to center conductor spacing. Consequently, adjacent bit positions along any propagation channel are separated by a distance $\sqrt{2}\,S$. This translation mechanism utilizes four sequential translation steps during which the bubble moves from an edge of one conductor to the attractive edge of the nearest activated conductor in the channel.

Due to the symmetry of the conductor pattern, for a given current sequence, the bubble can be translated along any of four orthogonal directions depending on the location and orientation of the particular propagation channel.

Figure 4:
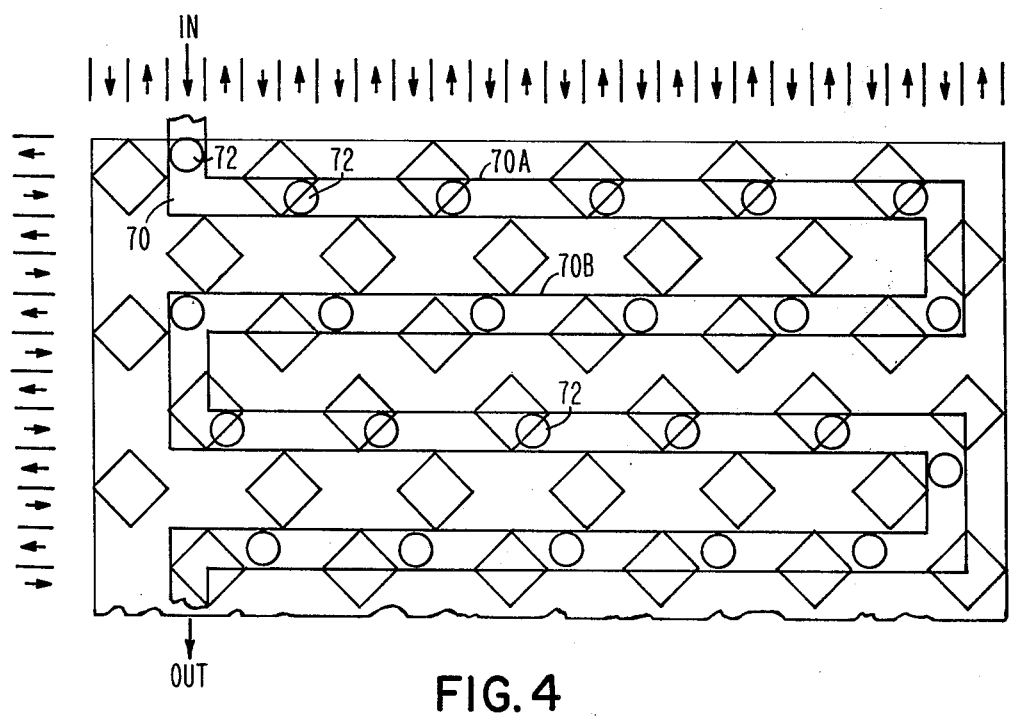
FIG. 4 is a schematic view of the shift register utilizing structure of FIG. 2.

A shift register in accordance with this invention is as shown in FIG. 4, with bit positions at step -1-. A channel 70 is provided in the bubble material. The channel 70 is formed in the preferred embodiment by etching a groove in the bubble material so that the width of the groove is equal to the bubble diameter. The channel may also be formed by other methods such as the use of a permalloy strip or an ion implanted region having the same shape as the desired channel. The dots 72 represent bits positions at step -1- current activation. As with conventional bubble memories, information can be coded by the presence or absence of a bubble at each bit position. Alternatively, a bubble may be present at each bit position while information is coded by employing at least two different kinds of bubbles, distinguishable by their respective wall states, for instance. As shown in FIG. 4, the bubble diameter which is equal to the channel width is about one fourth the bit separation along the translation channel 70. As before, a sequence -1-2-3-4- will move the bubble from one bit position to the next bit position. On adjacent channels, the distance between the center of channel 70A to the center of channel 70B should be $NS/\sqrt{8}$ where $N \geq 3$ for memories coded by the presence or absence of bubbles. For this device, the attained storage density equals one bubble per twelve $d^2$ area, whereas in conventional field access bubble memories, a storage density of one bubble per twenty $d^2$ area is achieved. For memories coded by different kinds of bubbles, the distance between the center of channel 70A to the center of channel B is $NS/\sqrt{8}$ where $N \geq 2$.

Not shown in FIG. 4 are bubble generating means at the input of the shift register and bubble sense means at the shift register output.

Figure 6:
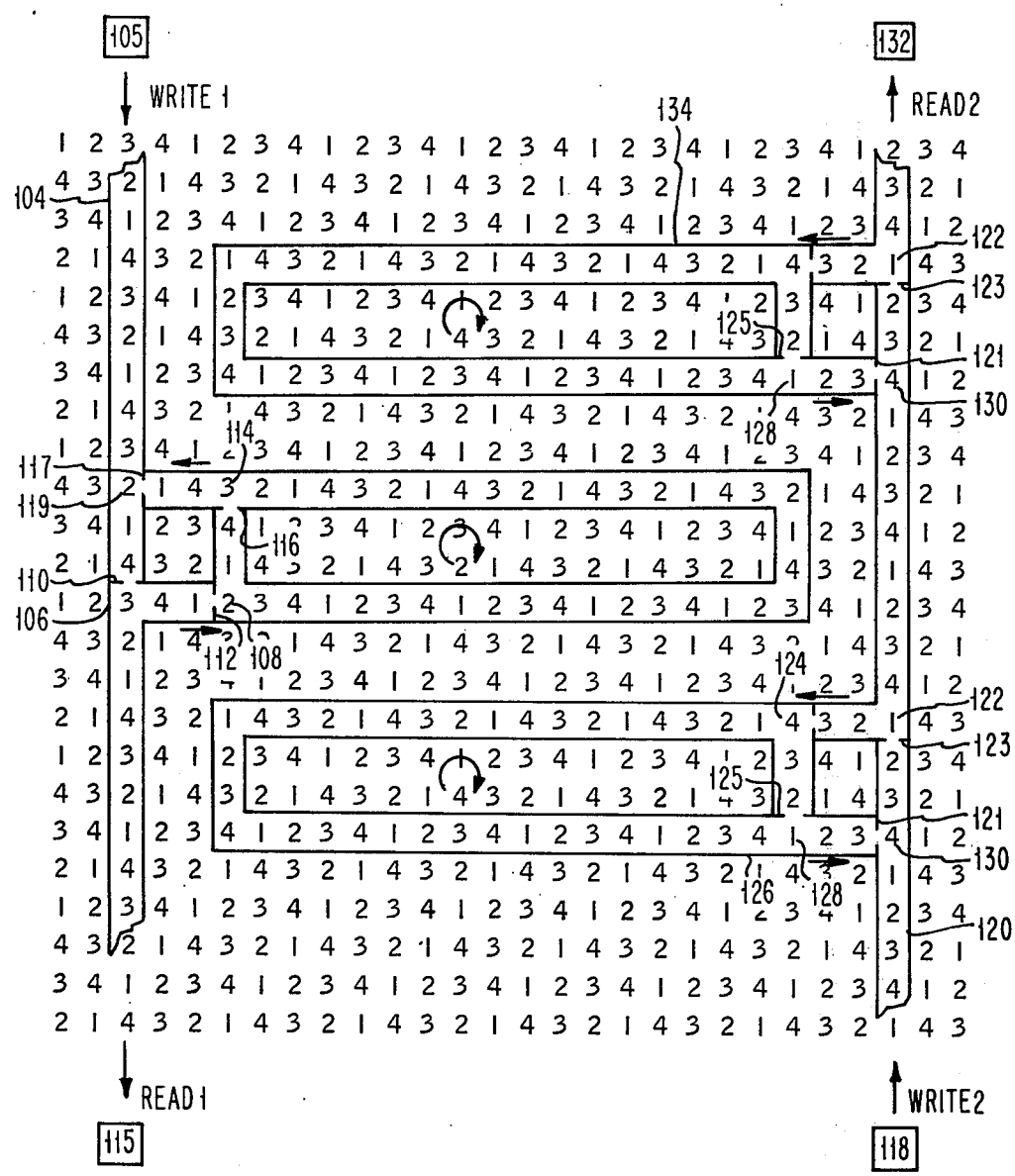
FIG. 6 is a schematic view of a major/minor loop architecture utilizing the structure of FIG. 2.

It is well known that improved access performance characteristics are achieved with systems using interconnected bubble propagation tracks. Such a major/minor loop arrangement in accordance with this invention is shown in FIG. 6, as will be hereinafter more fully discussed. In designing or analyzing such a system, it is convenient to label, within the grid of potential channel locations, the bit positions for the four different current directions -1,-2,-3,-4, as has been done in FIG. 6. This bit position matrix allows one to follow the propagation path of each bubble within a given channel layout for any particular sequence of the drive currents. The current sequence may be forward (-1-2-3-4-), or reverse (-4-3-2-1-), and may change from forward to reverse and vice versa at any step in the sequence. Conversely, the bit position matrix may be used as an aid in designing a suitable channel layout in that one simply arranges horizontal and vertical channel segments along successive bubble positions corresponding to the chosen current sequence.

Figures 5A, 5B:
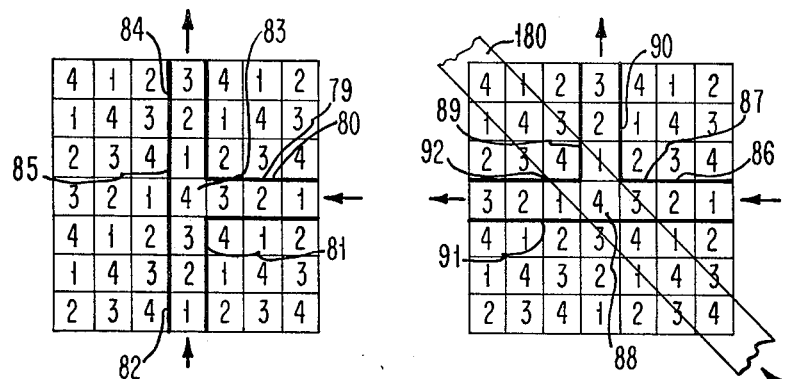
FIGS. 5a through 5d are schematic views of various component type functions performed by structure of FIG. 2.

Layouts on this grid are not limited to shift registers such as shown in FIG. 4 since it may contain junctions and branch points as well in the form of a "T" configuration as shown in FIG. 5. FIG. 5A shows a channel junction where on forward drive, bubbles in channels 80 or 82 pass through input ports 79 and 81 respectively, merge in space 83 or the "4" position, pass through output port 85, and continue along channel 84. Such a junction thus represents a "merge element." FIG. 5B shows a branch point where bubbles from channel 86 pass through input port 87 and into space 88 or the "4" position where there is a choice to continue either along channel 90 or 92. Since either channel 90 or 92 is equally favorable, such a branch point represents a "switch element." The bubbles can be directed through output port 89 or output port 91 into either channel 90 or channel 92 respectively by applying some directional bias during the step -4- to -1-. Such a bias can be produced with a superposed wide control conductor 180 in FIG. 5B carrying a current having a direction such that the attractive conductor edge is located in the selected channel direction, i.e.. current going in one direction selects one channel, while current going in the opposite direction selects the other channel.

Figure 5C:
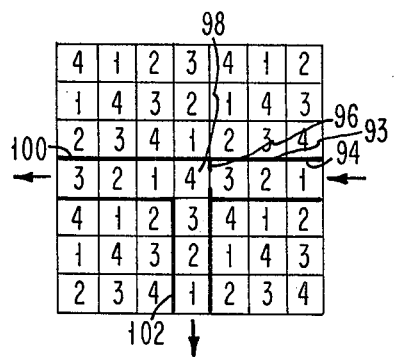
Figure 5D:
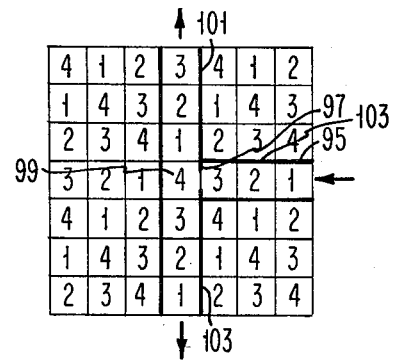

In accordance with a preferred embodiment of this invention, a switch control method is disclosed in FIGS. 5C and 5D which does not require any additional control conductor but operates on sequence control. With this approach, selection of the current sequence -1-2-3-4- vs. -4-3-2-1- determines the resulting propagation channel. With this type of sequence controlled switch, one additional element is required in the channel configuration. This additional element is a small barrier 96 in the input port 93 of the entrance channel 94. The bubble propagates along channel 94 on sequence -1-2-3-4- through input port 93 to space 98 at the "4" position which is the branch point. Exit channel 100 is selected by continuing with the same current sequence -1-2-3-4- whereas exit channel 102 is selected by reversing the sequence to -3-2-1-4-. It is the function of the entrance barrier 96 to prevent on the latter sequence backtracking of the bubble into input port 93 and back along the entrance channel 94. The barrier only needs to provide some asymmetry at the switch location 98 which favors channel 102 over channel 94. Such asymmetry can be easily obtained through a small reduction in the width of the entrance channel, for instance, by barriers 96.

In FIG. 5D, the bubble propagates along channel 95 on the sequence -1-2-3-4- through input port 103 to space 99 at the "four" position which is the branch point. Exit channel 101 is selected by continuing the same current sequence -1-2-3-4 where as exit channel 103 is selected by reversing sequence to -3-2-1-4-. Again, it is the function of the entrance barrier 97 to prevent on the latter sequence backtracking of the bubble into input port 103 and back along the entrance channel 95. FIGS. 5C and 5D thus represent sequence controlled "switch elements" in accordance with this invention.

In a preferred embodiment of this invention, two independently addressable major/minor loop systems with sequence control of all functions are shown in FIG. 6. As in any system, in accordance with this invention, information is represented either by the presence or absence of a bubble at a bit position, or by having one or the other of two kinds of bubbles at a bit position. In FIG. 6, the bubble diameter and channel width are equal to one fourth the bit separation along the propagation channels of the system. The operation of the two systems shown in FIG. 6 involves five distinct accessing functions which are: Write Major Loop; Transfer In; Access Minor Loop; Transfer Out; and Read Major Loop. To write a word of information, that is, a series of N data bits, into the major loop 104 of system I [Write Major Loop], bubbles are serially generated at 105 by means well known in the art and propagated down the major loop 104 on the current sequence -4-3-2-1-. This current sequence is maintained until each of the N data bits arrives with current '3' at a "Transfer-In" location 106 of the N minor loops. Only one such minor loop 108 is shown with system I in FIG. 6. Barrier 117 serves to prevent the insertion of bubbles into the minor loops while the N data bits propagate down the major loop 104 on the -4-3-2-1- current sequence. To transfer the N data bits in parallel into the N minor loops, a current sequence -3-4-1-2- is used which completes the "Transfer-In" operation with a data bit at current '2' on location 118 in the minor loop 108. Barrier 110 serves to prevent backtracking of the bubble along the major loop during the first (3-4) step of the Transfer-In operation.

To read a word of information located at identical bit positions in the N minor loops, the current sequence -4-3-2-1- is employed in the "Access Minor Loop" operation. The N data bits then propagate in the N minor loop 108 in a clockwise direction. This current sequence is maintained until each of the N data bits arrives with current '3' at a "Transfer-Out" location 114 of the N minor loops. To transfer the N data bits in parallel back into the major loop 104, a current sequence -3-4-1-2- is used which completes the "Transfer-Out" operation with one data bit at current '2' on location 119 in the major loop 104. Barrier 116 serves to prevent backtracking of the bubble along the minor loop during the first (3-4) step of the Transfer-Out operation. The word of data bits is finally read serially by propagating the bubbles down the major loop 104 on the current sequence -4-3-2-1- and through read means 115 well known in the art. Again, barrier 117 serves to prevent the insertion of bubbles into minor loops during this "Read Major Loop" operation.

A second independable addressable major/minor loop system can be utilized on the same conductor array grid system. In the second system, bubbles are serially generated at 118 by means well known in the art on the current sequence -4-3-2-1-. This current sequence is maintained until each of the N data bits arrives at current '1' at a "Transfer-In" location 122 of N minor loops. Two such minor loops 126 and 134 are shown with system 2 in FIG. 6. Barrier 121 serves to prevent the insertion of bubbles into the minor loops while the N data bits propagate down the major loop 120 on the -4-3-2-1- current sequence. To transfer the N data bits in parallel into the N minor loops 126 and 134, a current sequence -1-2-3-4- is used which completes the "Transfer-In" operation with a data bit at current '4' on location 124 in the minor loop 126. Barrier 123 serves to prevent backtracking of the bubble along the major loop 120 during the first (1-2) step of the Transfer-In operation.

To read a word of information located at identical bit positions in the N minor loops 126 and 134, the current sequence -4-3-2-1- is employed in the (access minor loop) operation. The N data bits then propagate the N minor loops 126 and 134 in a clockwise direction. This current sequence is maintained until each of the N data bits arrives with current '1' at a "Transfer-Out" location 128 of the N minor loops. To transfer the N data bits in parallel back into the major loop 120, the current sequence -1-2-3-4- is used which completes the "Transfer-Out" operation with one data bit at current '4' on location 130 in the major loop 120. Barrier 125 serves to prevent backtracking of the bubble along the minor loop during the first (1-2) step of the transfer-out operation. The word of data bits is finally read serially by propagating the bubbles down the major loop 120 on the current sequence -4-3-2-1- and through read means 132 well known in the art. Again, barrier 121 serves to prevent the insertion of bubbles into the minor loop during this (read/major loop) operation.

Although several preferred embodiments of this invention have been described, it is understood that numerous variations may be made in accordance with the principles of this invention.

What is claimed is:

1. A combination suitable for the propagation of bubbles in a bubble supporting material comprising
   a first array of regularly spaced parallel conductors connected in parallel to a first current source,
   a second array of regularly spaced parallel conductors being oriented substantially orthogonal to said conductors in said first array to form a region of intersections between said first array conductors and said second array conductors and connected in parallel to a second current source,
   a plurality of first parallel channels in the bubble supporting material in said region adapted for the movement of bubbles therein, said first channels positioned at an angle of $+45°$ to said conductors in said first array to define a first propagation axis, and
   a plurality of second parallel channels in the bubble supporting material in said region adapted for the movement of bubbles therein, said second channels positioned at an angle of $-45°$ to said conductors in said first array to define a second propagation axis orthogonal to said first propagation axis.

2. A combination as described in claim 1 wherein the number of said conductors in said first array is substantially the same as the number of said conductors in said second array.

3. A combination as described in claim 1 wherein said conductors in said first array are electrically insulated from said conductors in said second array.

4. A combination as described in claim 1 wherein said conductors in said first array and in said second array occupy the same plane to form a continuous sheet having an array of holes therein.

5. A combination as described in claim 1 wherein the conductors in said first array electrically connected to the conductors in said second array to provide a first source circuit being electrically orthogonal to a second source circuit.

6. A combination suitable for the propagation of bubbles in a bubble supporting material comprising
   a first array of regularly spaced parallel conductors connected to a first current source, said conductors in said first array having a spacing S between centers of adjacent conductors,
   a second array of regularly spaced parallel conductors being oriented substantially orthogonal to said conductors in said first array to form a region of intersections between said first array conductors and said second array conductors and connected to a second current source, said conductors in said second array having substantially the same spacing as said conductors in said first array, said second array conductors intersecting said first array conductors to provide intersection centers,
   a plurality of first parallel channels in the bubble supporting material in said region adapted for the movement of bubbles therein, said first channels positioned at an angle of +45° to said conductors in said first array to define a first propagation axis, said first channels having a width of the order of d where d is the bubble diameter, said first channels having a center line being spaced from the nearest intersection center by a distance of about $\sqrt{2}\,S/8$, and a plurality of second parallel channels adapted for the movement of bubbles therein, said second channels positioned at an angle of −45° to said conductors in said first array to define a second propagation axis orthogonal to said first propagation axis, said second channels having a center line being spaced from the nearest intersection center by a distance of about $\sqrt{2}\,S/8$.

7. A combination as described in claim 6 wherein the width of said conductors in said first array is about S/2.

8. A combination as described in claim 6 wherein the width of said first channels is about the diameter of the bubble being propagated.

9. A combination as described in claim 8 wherein the width of said first channels is from S/4 to S/2.

10. A combination as described in claim 6 wherein said first channels are defined by areas of bubble supporting material having a reduced thickness.

11. A combination as described in claim 6 wherein said first channels are defined by areas of bubble supporting material having a thin film of a soft magnetic material thereon.

12. A combination as described in claim 6 wherein said first channels are defined by areas of bubble supporting material that are ion implanted.

13. A combination suitable for the propagation of bubbles in a bubble supporting material comprising a first array of regularly spaced parallel conductors connected to a first current source, said conductors in said first array having a spacing S between centers of adjacent conductors, a second array of regularly spaced parallel conductors being oriented substantially orthogonal to said conductors in said first array to form a region of intersections between said first array conductors and said second array conductors and connected to a second current source, said conductors in said second array having substantially the same spacing as said first array conductors, said second array conductors intersecting said first array conductors to provide intersection centers, a plurality of first parallel channels in the bubble supporting material in said region adapted for the movement of bubbles therein, said first channels positioned at an angle of +45° to said conductors in said first array to define a first propagation axis, said first channels having a center line being spaced from the nearest intersection center by a distance of about $\sqrt{2}\,S/8$, a plurality of second parallel channels adapted for the movement of bubbles therein, said second channels positioned at an angle of −45° to said conductors in said first array to define a second propagation axis orthogonal to said first propagation axis, said second channels having a center line being spaced from the nearest intersection center by a distance of about $\sqrt{2}\,S/8$, an input port, and an output port, said output port being connected to said input port by at least one continuous rectilinear channel consisting of segments of said first channels and said second channels to form a shift register.

14. A combination suitable for the propagation of bubbles in a bubble supporting material comprising a first array of regularly spaced parallel conductors connected to a first current source, said conductors in said first array having a spacing S between centers of adjacent conductors, a second array of regularly spaced parallel conductors being oriented substantially orthogonal to said conductors in said first array to form a region of intersections between said first array conductors and said second array conductors and connected to a second current source, said conductors in said second array having substantially the same spacing as said conductors in said first array, said second array conductors intersecting said first array conductors to provide intersection centers, a plurality of first parallel channels in the bubble supporting material in said region adapted for the movement of bubbles therein, said first channels positioned at an angle of +45° to said conductors in said first array to define a first propagation axis, said first channels having a center line being spaced from the nearest intersection center by a distance of about $\sqrt{2}\,S/8$, a plurality of second parallel channels adapted for the movement of bubbles therein, said second channels positioned at an angle of −45° to said conductors in said first array to define a second propagation axis orthogonal to said first propagation axis, said second channels having a center line being spaced from the nearest intersection center by a distance of about $\sqrt{2}\,S/8$, and one of said first channels and one of said second channels combining to form a "T" arrangement, said "T" arrangement having at least one input port adapted for bubbles to enter said "T" arrangement and at least one output port adapted for bubbles to leave said "T" arrangement.

15. A combination as described in claim 14 wherein said "T" arrangement includes a second input port to form a merge element adapted to merge bubbles from said first input port with bubbles from said second input port to pass through said output port.

16. A combination as described in claim 14 wherein said "T" arrangement includes a second output port to form a switch element adapted to switch bubbles from said input port into one of said first and second output ports.

17. A combination as described in claim 16 including control conductor means adapted to control said switch element.

18. A combination as described in claim 16 including gate means on said input port adapted to prevent bubbles from propagating back into said input port when the current sequence is reversed.

19. A combination as described in claim 18 wherein said gate means is a constriction in the width of said channel associated with said input port.

20. A combination suitable for the propagation of bubbles in a bubble supporting material comprising a first array of regularly spaced parallel conductors connected to a first current source, said conductors in said first array having a spacing S between centers of adjacent conductors, a second array of regularly, spaced parallel conductors being oriented substantially orthogonal to said conductors in said first array to form a region of intersections between said first array conductors and said second array conductors and connected to a second current source, said conductors in said second array having substantially the same spacing as said conductors in said first array, said second array conductors intersecting said first array conductors to provide intersection centers, a plurality of first parallel channels in the bubble supporting material in said region adapted for the movement of bubbles therein, said first channels positioned at an angle of $+45°$ to said conductors in said first array to define a first propagation axis, said first channels having a center line being spaced from the nearest intersection center by a distance of about $\sqrt{2}\, S/8$, and a plurality of second parallel channels adapted for the movement of bubbles therein, said second channels positioned at an angle of $-45°$ to said conductors in said first array to define a second propagation axis orthogonal to said first propagation axis, said second channels having a center line being spaced from the nearest intersection center by a distance of about $\sqrt{2}\, S/8$, said first channels and said second channels arranged to form a major/minor loop accessing organization.

21. A combination suitable for the propagation of bubbles in a bubble supporting material comprising a first array of regularly spaced parallel conductors connected to a first current source, said conductors in said first array having a spacing S between centers of adjacent conductors, a second array of regularly spaced parallel conductors being oriented substantially orthogonal to said conductors in said first array to form a region of intersections between said first array conductors and said second array conductors and connected to a second current source, said conductors in said second array having substantially the same spacing as said conductors in said first array, said second array conductors intersecting said first array conductors to provide intersection centers, a plurality of first parallel channels in the bubble supporting material in said region adapted for the movement of bubbles therein, said first channels positioned at an angle of $+45°$ to said conductors in said first array to define a first propagation axis, said first channels having a center line being spaced from the nearest intersection center by a distance of about $\sqrt{2}\, S/8$, and a plurality of second parallel channels adapted for the movement of bubbles therein, said second channels positioned at an angle of $-45°$ to said conductors in said first array to define a second propagation axis orthogonal to said first propagation axis, said second channels having a center line being spaced from the nearest intersection center by a distance of about $\sqrt{2}\, S/8$, and information being represented at selected positions in said first and second channels by the presence or absence of bubbles.

22. A combination as described in claim 21 wherein the center of a first channel containing bubbles is spaced a distance of $N\, S/\sqrt{8}$ from the center of an adjacent first channel containing bubbles where $N \geq 3$.

23. A combination suitable for the propagation of bubbles in a bubble supporting material comprising a first array of regularly spaced parallel conductors connected to a first current source, said conductors in said first array having a spacing S between centers of adjacent conductors, a second array of regularly spaced parallel conductors being oriented substantially orthogonal to said conductors in said first array to form a region of intersections between said first array conductors and said second array conductors and connected to a second current source, said conductors in said second array having substantially the same spacing as said conductors in said first array, said second array conductors intersecting said first array conductors to provide intersection centers, a plurality of first parallel channels in the bubble supporting material in said region adapted for the movement of bubbles therein, said first channels positioned at an angle of $+45°$ to said conductors in said first array to define a first propagation axis, said first channels having a center line being spaced from the nearest intersection center by a distance of about $\sqrt{2}\, S/8$, a plurality of second parallel channels adapted for the movement of bubbles therein, said second channels positioned at an angle of $-45°$ to said conductors in said first array to define a second propagation axis orthogonal to said first propagation axis, said second channels having a center line being spaced from the nearest intersection center by a distance of about $\sqrt{2}\, S/8$, and information being represented at selected positions in said first and second channels by a bubble from a group containing at least two types of bubbles.

24. A combination as described in claim 23 wherein the center of a first channel containing bubbles is spaced a distance of $N\, S/\sqrt{8}$ from the center of an adjacent first channel containing bubbles where $N \geq 2$.

25. A method for switching an isolated bubble in a "T" shaped channel configuration located underneath first and second arrays of parallel conductors oriented substantially orthogonal to each other and having an input port adapted for bubbles to enter the "T" and a first output port and a second output port adapted for said bubble to leave the "T" comprising the steps applying a first current sequence to said first and second arrays to propagate said bubble through said input port, providing barrier means on said input port to prevent said bubble from backtracking therein, and applying a second current sequence to said first and second arrays to propagate said bubble through one of said output ports.

26. A method as described in claim 25 whereby the second current sequence is the same as the first current sequence and said bubble is switched through said first output port.

27. A method as described in claim 25 whereby the second current sequence is the reverse of the first current sequence and said bubble is switched through said second output port.

* * * * *